United States Patent
Woosnam (10) Patent No.: US 9,094,089 B2
(45) Date of Patent: Jul. 28, 2015

(54) GIMBALED MOUNT SYSTEM FOR SATELLITES

(71) Applicant: Technology Mining Company, LLC, Addison, TX (US)

(72) Inventor: Calvin H. Woosnam, Coquitlam (CA)

(73) Assignee: Technology Mining Company LLC, Addison, TX (US)

( * ) Notice: Subject to any disclaimer, the term of this patent is extended or adjusted under 35 U.S.C. 154(b) by 0 days.

(21) Appl. No.: 13/865,668

(22) Filed: Apr. 18, 2013

(65) Prior Publication Data

US 2013/0277523 A1    Oct. 24, 2013

Related U.S. Application Data

(63) Continuation of application No. 12/912,501, filed on Oct. 26, 2010, now abandoned, which is a continuation of application No. 12/020,269, filed on Jan. 25, 2008, now abandoned.

(60) Provisional application No. 60/886,905, filed on Jan. 26, 2007.

(51) Int. Cl.

| | |
|---|---|
| H01Q 1/12 | (2006.01) |
| H04B 7/185 | (2006.01) |
| H04H 20/02 | (2008.01) |
| H04H 20/61 | (2008.01) |
| H04W 28/04 | (2009.01) |
| F16F 15/121 | (2006.01) |
| F16M 13/02 | (2006.01) |
| H01Q 1/00 | (2006.01) |
| H01B 7/17 | (2006.01) |
| H01B 11/22 | (2006.01) |
| H04B 1/38 | (2015.01) |
| H05K 7/10 | (2006.01) |
| H05K 7/20 | (2006.01) |
| H04H 20/59 | (2008.01) |
| H04H 40/90 | (2008.01) |

(52) U.S. Cl.
CPC ............ *H04B 7/1851* (2013.01); *F16F 15/121* (2013.01); *F16M 13/022* (2013.01); *H01B 7/17* (2013.01); *H01B 11/22* (2013.01); *H01Q 1/005* (2013.01); *H01Q 1/125* (2013.01); *H04B 1/38* (2013.01); *H04H 20/02* (2013.01); *H04H 20/61* (2013.01); *H04W 28/04* (2013.01); *H05K 7/1015* (2013.01); *H05K 7/2039* (2013.01); *H04H 20/59* (2013.01); *H04H 40/90* (2013.01)

(58) Field of Classification Search
CPC ..... H01Q 1/125; H01Q 1/005; F16M 13/022; F16F 15/121
USPC .......................... 343/878, 880, 882, 761, 763
See application file for complete search history.

(56) References Cited

U.S. PATENT DOCUMENTS

| | | | | |
|---|---|---|---|---|
| 3,277,486 A * | 10/1966 | Kuebler | .......................... | 343/705 |
| 4,596,989 A * | 6/1986 | Smith et al. | ................... | 343/709 |
| 4,598,297 A * | 7/1986 | Hawkins | ........................ | 343/882 |
| 4,685,649 A * | 8/1987 | McKay | .......................... | 248/594 |
| 5,485,169 A * | 1/1996 | Kitabatake et al. | ........... | 343/765 |

* cited by examiner

*Primary Examiner* — Hoanganh Le (74) *Attorney, Agent, or Firm* — Squire Patton Boggs (US) LLP (57) ABSTRACT

Described herein is a method and system for gimbaled mounting of satellite dishes. The gimbaled mount for satellite systems overcomes some of the most common negative events affecting satellite communications. The system is a cost effective solution that amortizes the cost of the additional equipment to well over the customary three to five years for satellite use and extends its working life expectancy to 20 years or more. Utilization of stainless steel rather than normal steel or lighter duty aluminum further extends the mounting systems longevity. The inclusion of an environmental feedback system for both snow and ice damage, wind damage, and earthquake damage increases the projected useful life of the mounting system.

18 Claims, 10 Drawing Sheets

FIG. 1

GIMBALED MOUNT SYSTEM DRAWINGS

GIMBALED MOUNT SYSTEM FOR SATELLITES

CROSS-REFERENCES TO RELATED APPLICATIONS

This application is a Continuation of U.S. application Ser. No. 12/912,501, filed Oct. 26, 2010, which is a Continuation of U.S. application Ser. No. 12/020,269, filed Jan. 25, 2008, which claims priority of U.S. Provisional Patent Application No. 60/886,905, filed Jan. 26, 2007, all of which are incorporated by reference in their entirety.

FIELD OF THE INVENTION

The present invention was designed as primary component within a larger communications system. This proposed communications component addresses the need for a more robust connection between devices that may be relied on during an emergency or security event and cannot be allowed to fail while facilitating security and normal communications services during normal times. The nature of this design allows for variation in capacity and size within tight design constraints that insure compliance with the engineering principles that insure performance during a stressful situation whether the actions are thermal or mechanical in nature.

More particularly, the present invention addresses the need for a reliable weather resistant mounting system for satellites.

BACKGROUND OF THE INVENTION

Satellite communications in the past required precision alignment of the dish system, to comply with an aperture of 1.5 to 2.0 degrees maximum movement to be still adequately in the download or upload beam to permit proper data or signal transfer. This critical alignment can easily be thrown out of alignment during an earthquake, building or ground settling condition, or severe weather wind type calamity.

Satellite communications systems, once they are aligned, are considered to be more robust than terrestrial communications lines, especially when those lines are subject to events such as an earthquake, flood, or high wind condition.

Typically satellite systems are put into operation some time during their life span, typically 15 years for a specific satellite. Any corrective positioning, which has occurred on several satellites in orbit currently and in the past, requires direct technical support and re-alignment of the earth station equipment to take into account the positional movement.

Weather conditions are notorious for knocking out satellite earth stations and the smaller lower cost ones are very susceptible to weather outages. Larger network type earth stations usually or robust enough both in diameter and construction materials to withstand numerous weather events during their planned life span without causing unpreventable weather outages. Excluding rain fade which can only be addressed by larger dishes makes the smaller the dish more susceptible to snow and ice.

Typical wind loading on a dish, and more so on the larger the dish, can throw alignment, temporarily or permanently until a technician can re-align the earth station dish assembly. In view of extensive experience with conventional earth stations, it is believed that conventional earth stations lack any self compensating mechanism, except for those conventional stations that are fully motorized. Furthermore the awareness or call out for re-alignment of earth stations has been more than the norm in the past, especially on small aperture dishes such as a Very Small Aperture Terminal (VSAT), which is a two-way satellite ground station with a dish antenna that is smaller than 3 meters. Especially after a storm or serious snow fall, VSAT re-alignment may be needed.

Construction of most earth stations is made out of standard steel components with at the most only the primary bolts being made of stainless steel. This leads to much needed maintenance and painting needing to be the VSAT to be down to maintain the appearance, to reduce corrosion, and to maintain functionality of the typical earth station.

Snow and ice can be detrimental to proper earth station operation. At times, on larger systems, crews may even have to go out and sweep off the snow to stop its affect on the large dishes. Similarly the buildup of ice from snow melting on the warm electronics located at the feed assembly can cause serious ice loading lower on the dish. Smaller home or commercial VSAT type dishes are notorious for loosing satellite connectivity during heavy snow fall till someone goes out and cleans them off.

SUMMARY OF THE INVENTION

It is an object of the present invention to obviate or mitigate at least one or more disadvantages of previous communications systems.

A Gimbaled Mount Satellite System in accordance with the present invention may only need to be critically aligned once during initial installation and all subsequent weather or environmental factors acting upon the system may be dealt with by the earth station facilities built into the Gimbaled Mount Satellite System, in accordance with the present invention.

The unique design incorporated a Gimbaled Mount Satellite system, in accordance with the present invention, uses the principles of gimbals which like a sea compass, uses the earths gravity pulling down perpendicularly on the suspend device to keep it flat surfaced and viewable to the viewer.

The unique mechanical design of the Gimbaled Mount System uses near frictionless pivotal bearings rather than typical sealed ball or roller bearings for all pivot points. This may allow for many years of unattended operation for a typical system.

The construction of the Gimbaled Mount System may be made almost entirely out of high grade, heavy gauge stainless steel construction, which may eliminate the need for painting and preventing rust from affecting its long term continuous operation and extending its lifespan.

The low profile, low wind resistance design and adjustable mounting legs along with compact non-penetrating foot print makes the Gimbaled Mount System ideal for most flat or near flat roofs.

The incorporation of a low-power-demand-wind dampening system within the design of the Gimbaled Mount System may improve not only system survival following a high wind event but also the continuous operation of the earth stations primary function during a severe wind event.

Weather conditions vary significantly around the world, and snow or ice can be part of that common event. A Gimbaled Mount System, in accordance with the present invention, has an option for fully designed de-icing or snow melting system, which may prevent any such local weather problem from interfering with the operation of the earth station.

A Gimbaled Mount System in accordance with the present invention, may not need for an exterior bubble or dome type enclosure, therefore providing the ability to support multiple sizes of satellite dishes in both circular and elliptical designs, with only the center balance point needing to be determined before securing to the lower mounting plate.

Several suitable applications result from methods and devices described herein. Those skilled in the art will further appreciate the above-noted features and advantages of the invention together with other important aspects thereof upon reading the detailed description that follows in conjunction with the drawings.

BRIEF DESCRIPTION OF THE DRAWINGS

For more complete understanding of the features and advantages of the present invention, reference is now made to a description of the invention along with accompanying figures, wherein.

DETAILED DESCRIPTION

The Figures collectively represents actual sub sections of the fabrication drawings for the CommPuter controller communications controller, as disclosed in U.S. Provisional Patent Application No. 60/886,905, and which is incorporated herein by reference.

A Gimbaled Mount System design, in accordance with the present invention was derived from experience with the repeated historical failure of earth stations, that were required for communications purposes, being made inoperable following either an earthquake, that shifted the position of an existing structure, or where wind damage had occurred. The present invention addresses a design which is a component part of a much larger approach to emergency communications previously disclosed in U.S. Provisional Patent Application No. 60/886,905. The design and method described herein provides a method to recreate or fabricate, a fully functional device that significantly addresses the short falls or failures of previous systems and provides a more robust method of creating a earth station satellite system. The entire mechanism or invention may be manufactured out of stainless steel further, which may assure that this design may have a substantially longer lifespan then a typical earth station mechanism, which is made out aluminum and regular steel. The present invention compensates, at least in part, for wind storm or ice or snow build up has been taken into consideration and may ensure no outages for the this type of earth station. The construction, in accordance with the present invention may also benefit the building owner or manager to which this earth station is installed as it does not require large ballast materials to weigh down the structure nor does it require roof penetration for any of the mounting system.

Figure 1:
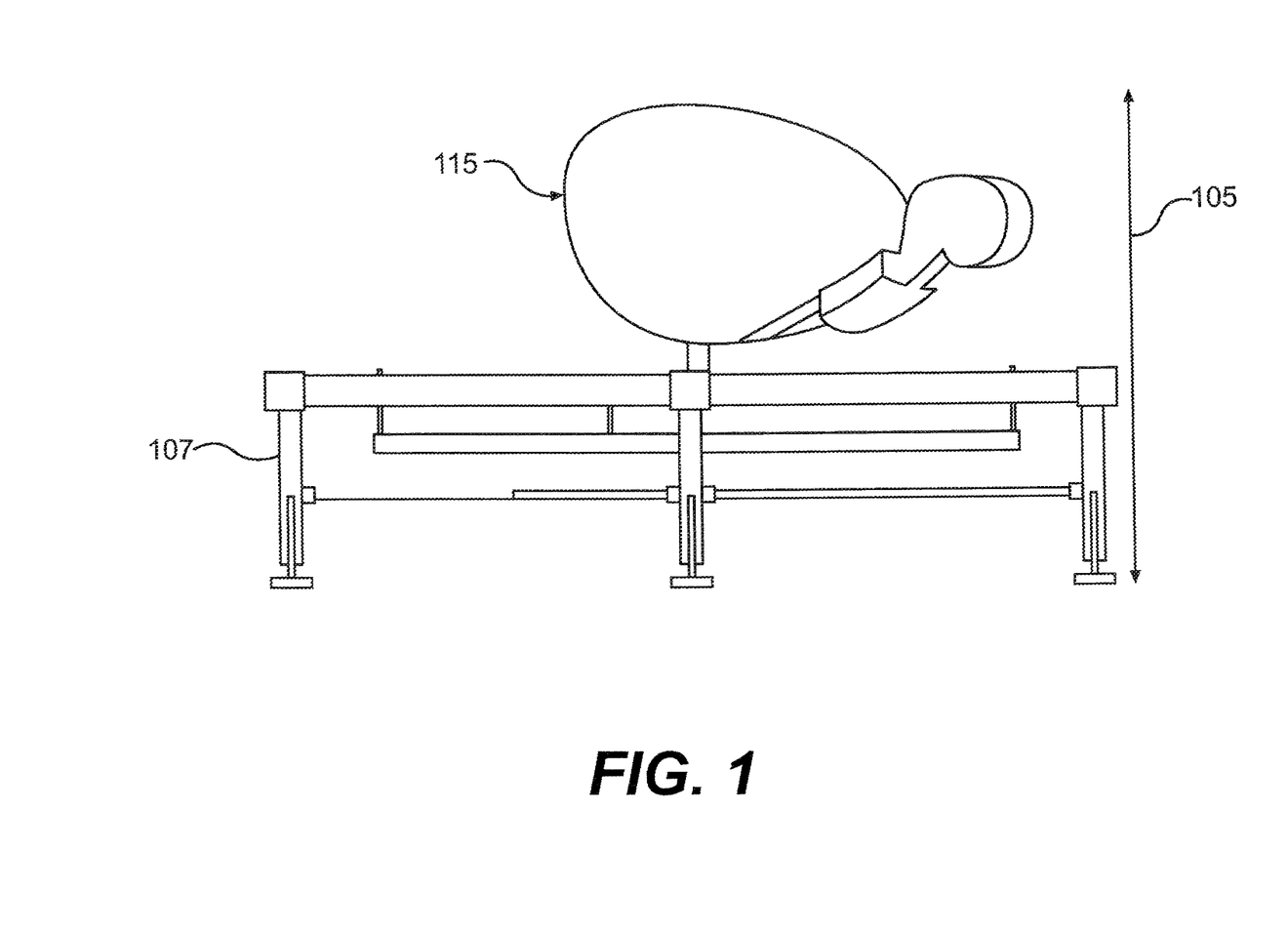
FIG. 1 is drawing of a Gimbaled Mount Satellite System, showing its mechanical low profile design from a side view, in accordance with an exemplary embodiment of the present invention.

A Gimbaled Mount System, in accordance with an exemplary embodiment of the present invention, begins with all components being manufactured out of heavy gauge marine grade stainless steel, typically of 0.025 inch thick material. This insures that corrosive weather action or chemicals will not affect the longevity of this system. The intention of this construction from the selection of every component is designed with consideration of this earth station remaining operable for 20 years. As satellite's in orbit generally do not last this long, the ability to easily align to an alternate satellite has been built into the basic design of this system. FIG. 1 shows a side view of a Gimbaled Mount Satellite System 100, in accordance with an exemplary embodiment of the present invention. Its low profile design 105 is shown from this side view, where the legs 107 are 24 inches high and the satellite dish 115, shown in this particular embodiment, is 24×36 inches.

Figure 5A:
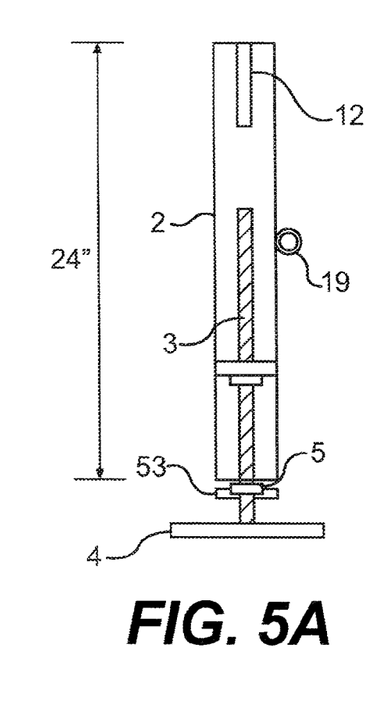
FIGS. 5A-5C are drawings of legs and feet for a Gimbaled Mount in accordance with the present invention, with several notations as to components making up this assembly.
Figure 5B:
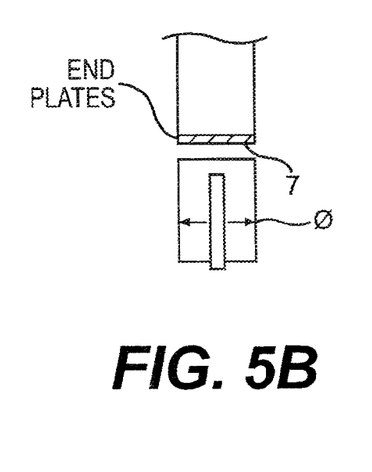
Figure 5C:
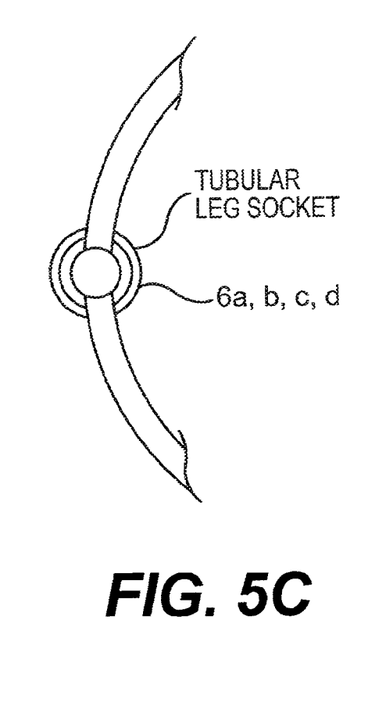

FIG. 5 is a drawing of legs and feet for a Gimbaled Mount in accordance with the present invention, with several notations as to components making up this assembly The legs, in accordance with an exemplary embodiment of the present invention, as detailed in FIG. 5, are made from a 24 inches long post 2, having a 1.00 inch O.D. stainless steel and a 0.125 wall thickness pipe. A slot 12, at least 2.00 inches deep and 9/32 inch wide, is cut at the middle of the top end of this pipe for sliding into a socket made on the outer 0.250 inch by 2 inches gimbaled ring. Also shown in FIG. 5 are: 53 adjustable leg screw; 4 foot plate; 5 adjustable leg locknut; 7 leg post top plate; 19 leg ring for tension cable pulley; and 6 *a, b, c, d* respective leg alignment plates, where only one of four is shown.

Figure 3A:
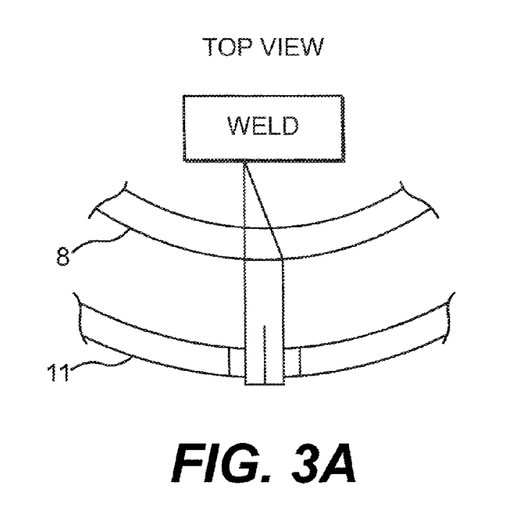
FIGS. 3A-3C show details of a pivot bearing design function to include a pivot point and v-groove in accordance with an exemplary embodiment of the present invention.
Figure 3B:
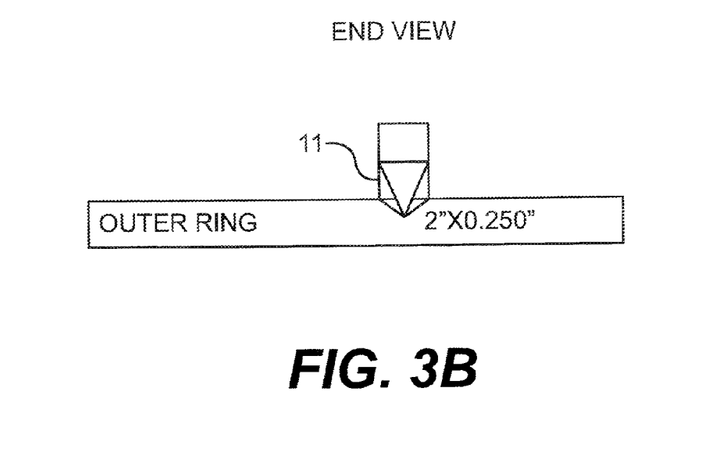
Figure 3C:
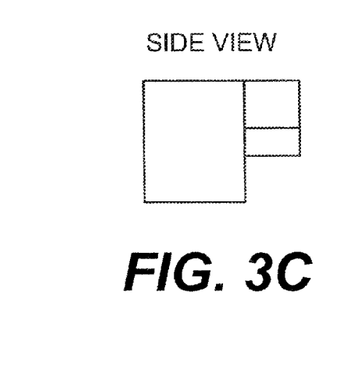

A 2 inch high by 0.250 inch thick stainless steel ring is rolled and curved into 2 sections with overlapping and bolted ends, forming the 48.0 inch outer ring. The bolt to hole ratio is tight so as to not create any flex in this ring when fully assembled. At the mid-point of each half section, or directly opposite each other on the overall 48.0 inch ring are cut 2 "V" grooves at approximately 45 degrees arc (see FIG. 3 note 11). FIG. 3 is a blown up drawing detailing the pivot bearing design function, with note 11 detailing a pivot point and V-groove relationship detail.

Similarly, in accordance with the present invention, on the 2 inch by 0.250 inch thick stainless steel outer ring, spaced exactly 90 degrees apart, equidistant from each other, are located 4×0.750 inch by 4 inch long, with a 9/32 inch slot×2 inches long, stainless steel pipe sections welded to outer ring, with the 2 inch extension hanging below the outer ring. This permits the Legs as described above to socket rigidly into the outer ring for stable operation.

The legs, in accordance with an exemplary embodiment, all have a 0.125 inch thick by 1 inch diameter round plate 527, with a captured and welded 0.625 threaded diameter nut and mating 5 (see FIG. 5 note 55). 700 hole on the plate. This permits a mating 5/8 inch threaded stock by 12 inches long rod 53 to be screwed in along with a 2 inch diameter by 0.125 thick end plate 5 welded to one end of the adjustable rod to act as the load bearing plate in contact with the roof. A ⅝ inch mating locking nut is pre-loaded to each rod during manufacturing to insure the rod does not go all the way into the leg socket and to also lock the position of each leg once the outer ring is made perfectly level.

Figures 2A, 2B, 2C, 2D, 2E:
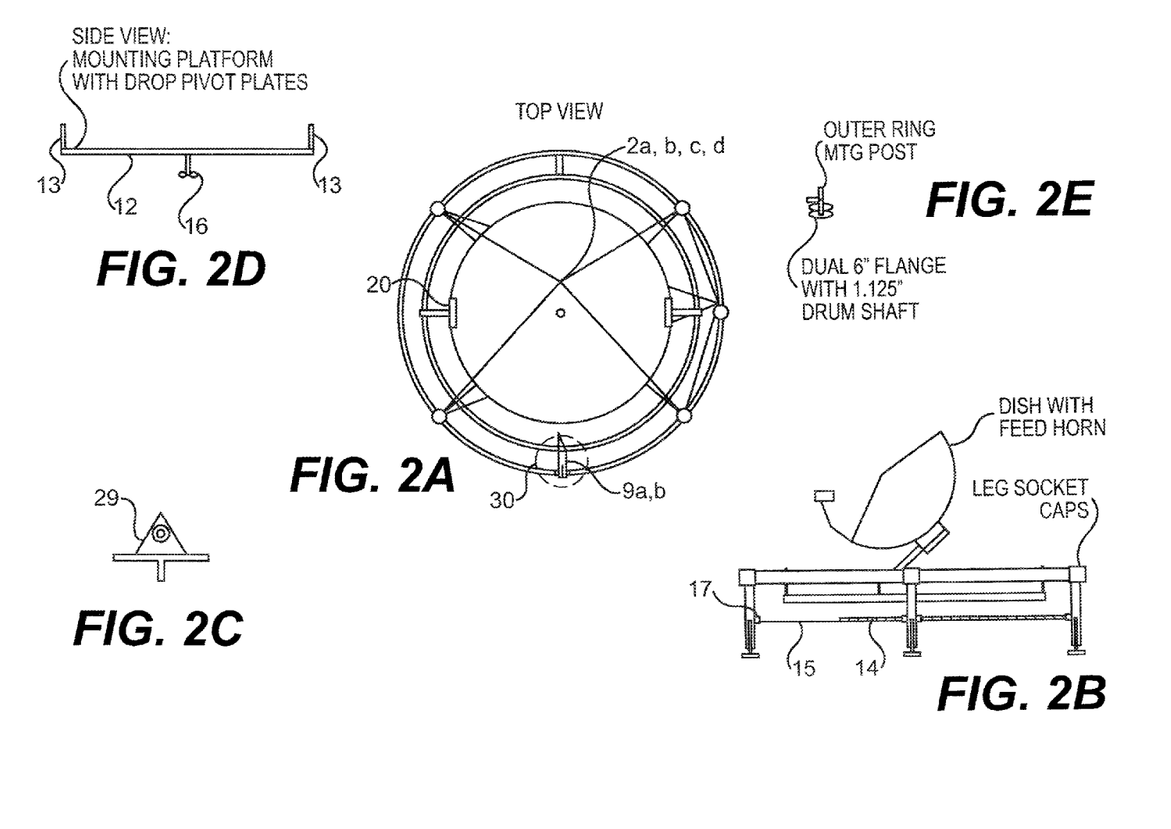
FIGS. 2A-2E show multiple views of a Gimbaled Mount in accordance with an exemplary embodiment of the present invention.

The outer ring 1, as shown in FIG. 2, top view, in accordance with an exemplary embodiment, is constructed in two sections to ease in taking components up a standard elevator to the rooftop installation. Once the outer ring is made perfectly level, using either a 5 foot long bubble level or 24 inch with a straight board, and spanning the entire outer ring diameter, the leg's lock nuts are tightened. This ensures no movement of the outer ring and a stable platform to build the gimbaled deck from.

The inner ring 8, in accordance with an exemplary embodiment, is constructed similar to the outer ring 1 of 2 inch high by 0.250 thick stainless steel, however the diameter when assembled is 4 inches smaller than the outer ring. Mid-Point on each arc of the Inner Ring is a welded drop type L-bracket 9. The protruding 3 inch portion of the this L-bracket has a beveled knife edge that will align with the two V-grooves in the Outer Ring. The L-bracket 9 lowers the Inner ring when suspended on the Outer Ring by 2 inches beginning the gravitational offset point. The mid-point opposite each other is additional V-grooves for accepting the Platform Plate.

The Platform Plate 12, in accordance with an exemplary embodiment, (see FIG. 7 note 12) is constructed and welded in one piece primarily with similar L-brackets 13 that rest in the V-grooves cut in the Inner Ring. Once again, the L-brackets 13 drop the Platform Plate approximately 4 inches from the height of the Inner Ring. The final assembly procedure for the Platform Plate is screw in on the underside of the Platform Plate in captured nut, the Dampening Spring Anchor Pin (see FIG. 7 note 16). Summarizing FIG. 2 shows: 1 Outer Gimbals Ring; 2 a, b, c, d, 24 inch leg posts; 3 adjustable leg screw; 4 foot plate; 5 adjustable leg locknut; 6 a, b, c, d leg alignment plates; 7 leg post top plate; 8 secondary inner ring; 9 a, b welded pivot L-brackets; 11 V groove pivot point; 12 platform plate; 13. platform plate L-brackets; 14 tension springs; 15 Dampening cables; 16 Anchor Pin; 17 Leg post pulley; 18 Aerometer mounting point; and 19 close-up leg ring for tension cable pulley.

Once the 2 rings and Platform Plate have been assembled and placed on the legs, the gimbaled operation begins. The next step is to take the dish and its plate mount system and bolt it to the correct holes on the Platform Plate to achieve balance when the Dish is mounted. The bolt slots in the Platform Plate allow for front to back movement of the Dish Mount plate and are positioned to accommodate several different dish size configurations. Once the Dish is properly mounted applying slight pressure to the Dish should cause the entire Platform Plate to move. Taking pressure off in a none windy condition should cause the Dish to return to "Plumb" state. Gravity does all the work to this point. The Dish although able to be roughly pointed at the correct satellite at this point, should be avoided till the Dampening System is installed.

Each of the 24 inch legs, and approximately 8 inches down from the top, if each tube, is welded a 1 inch x ⅝ inch hook, used for connecting or hanging a pulley with eyelet assembly for the wind dampening system. On one leg only, and before the foot post was fully inserted at manufacturing a spooling system is slid over the tube. (See FIG. 8) In constant wind loading areas a manual drum and tension system is utilized.

However, in wind conditions, a mounting system embodiment includes a remotely operated electric drum winch mechanism which is mounted on one of the legs pointing towards the inside of the Gimbaled Mount assembly. This is remotely operated, by an attached CommPuter controller system as disclosed both in U.S. Provisional Patent Application No. 60/886,905, and as also disclosed in US. application No., filed concurrently herewith, both which are incorporated herein by reference. A wind speed aerometer is inserted into the top side of the Outer ring assembly into the leg assembly holding the Winch assembly. A common service cable interconnects both the lower Winch unit and the aerometer for wind speed detection and CommPuter controller feedback which causes either the Winch to take up slack or release slack to the dampening cables.

Figure 6:
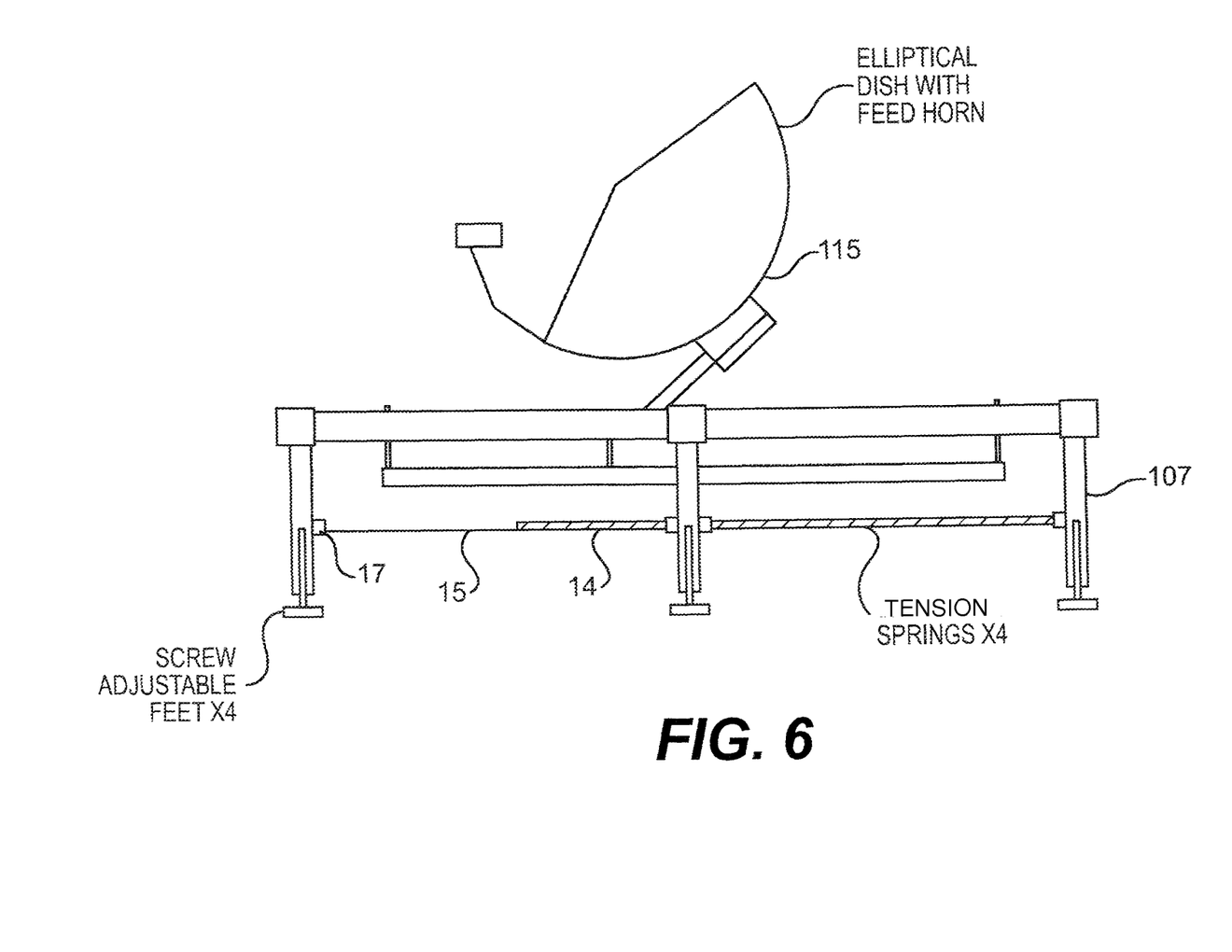
FIG. 6 is a drawing of the Gimbaled Mount wind dampening system, with several notations of components within this assembly.
Figure 7:
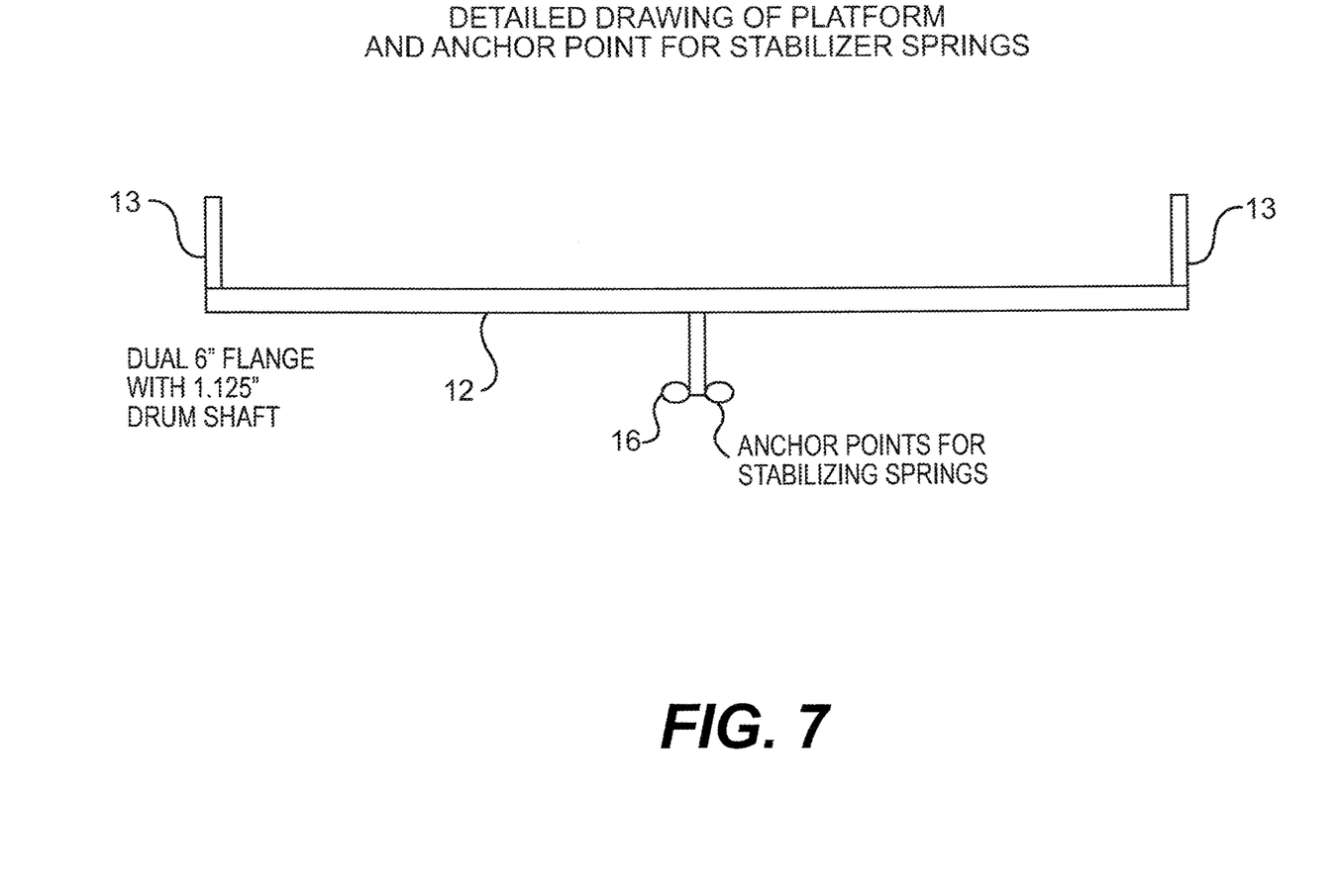
FIG. 7 is a Detailed drawing of the Platform (note 12) including anchor point pin (note 16) for stabilizer springs and Pivot hanging points (note 13)

The Dampening cables 15, in accordance with an exemplary embodiment, use an eyelet formed in the end located near the center of the Gimbaled Mount, and are attached to 4 long coil springs 14 with eyelets at each end, as shown in FIG. 6. (See FIG. 6 item 14) One end of the tension springs 14 is attached to the dampening cables 15 while their opposite ends are hooked over the Center Pin 16 of FIG. 7. Pin 16 extends down from the Center Platform 12 of the Gimbaled Mount, as shown in FIG. 7.

Figure 8:
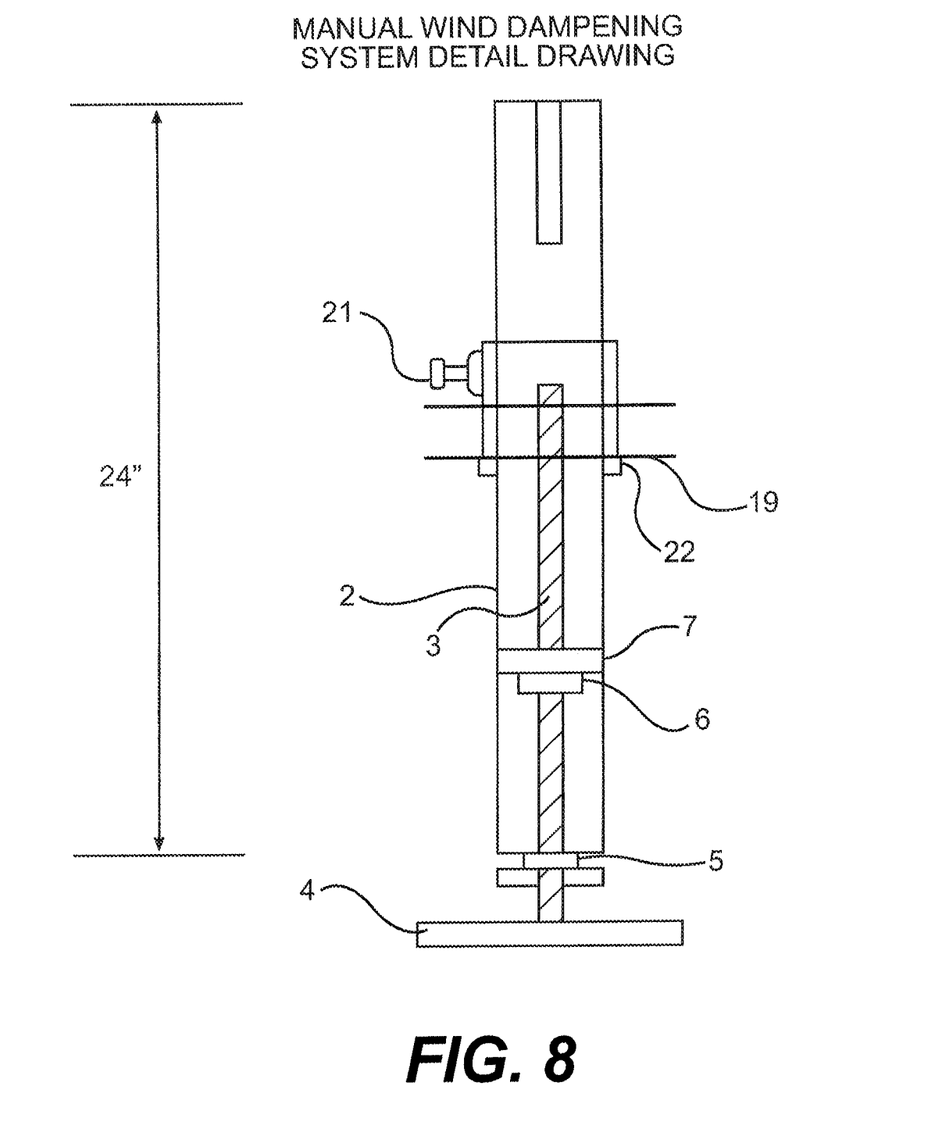
FIG. 8 is a Manual Wind Dampening System detail drawing, including several notations for components within this assembly.

The Dampening cables, when in an area with low wind problems, may be used with a Manual Wind Dampening System, as shown in FIG. 8. Gimbaled Mount System leg is modified to have a stop ring 22 welded approximately 13 inches down from the top of the post 2 (see notation #22 in FIG. 8 and in FIG. 9).

Figure 9:
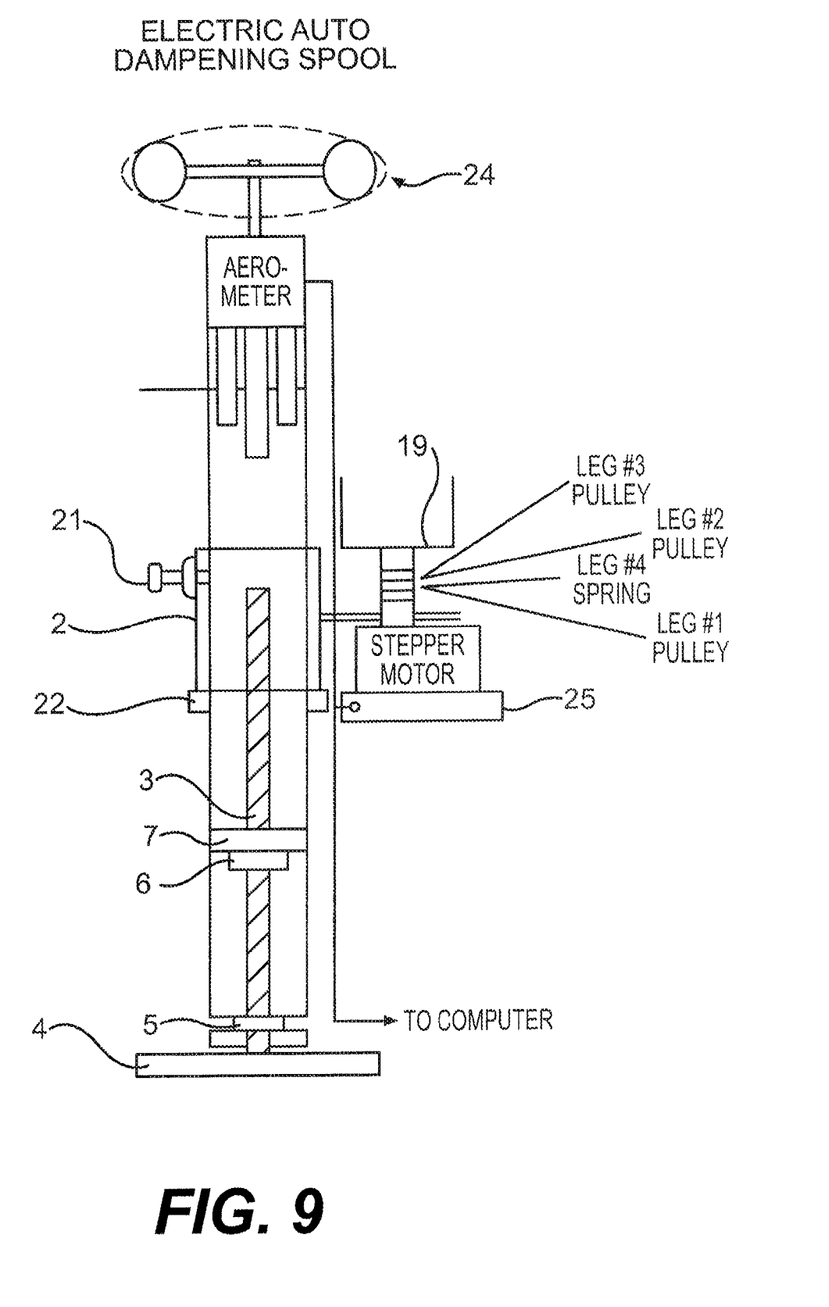
FIG. 9 is The Electric Automatic Wind Dampening System, with several notations regarding both the electric stepper motor winch and Aerometer feedback unit.

Once the Dampening cables 15 are secured to the loose end of the Tension Springs 14, the opposite end of the cable is routed back to their respective Legs #1, #2, #3 through respective pulleys 17 hooked into the hook welded on 3 of 4 Legs and then the cables are directed to the fourth Leg, spooling system. The shorter cable, of the 4 cables is secured to Tension Spring 14, and directed at Leg #4, and enters the spooling system, directly. FIG. 9

All Loose ends are looped once around the Spool drum core. The Loose ends are threaded through holes in the core of the Dampening Spool assembly. Cables are then brought taunt and secured without any stretching of the Tension Springs. The stretching of the Tension Springs is left to the Spool drum assembly.

The Manual Wind Dampening System, in accordance with an exemplary embodiment, and its spooling system, as shown in FIG. 8 has a ¼ inch locking bolt in the extend hub that locks the Spool when correct tension has been reached. The rotating of the Dampening Spool causes all tension springs to be equally tension loaded. This acts as a shock or wind sensitivity reducer and allows minor breezes to buffet the dish assembly without causing the Gimbaled Platform and subsequently the Dish from varying off the critical alignment directed at its specific satellite. FIG. 8, a Manual Wind Dampening spool, in accordance with the present invention, shows: 2 a 24 inch post tube; 3 adjustable leg screw; 4 foot plate; 5 adjustable leg locknut; 6 adjustable leg guide nut; 7 adjustable leg stabilizing plate; 20 Manual Dampening spool adjustment collar; 21 Manual Damping spool collar lock bolt; and 22 Dampening spool collar welded stops.

The Electric Automatic Wind Dampening System, in accordance with an exemplary embodiment, as depicted in FIG. 9 is comprised of two main devices affixed to Leg #4. The first device is an Electric Stepper Motor driven spooling system as shown by notation #19 in FIG. 9. This Stepper Motor is mounted on a slide on sleeve and bracket assembly as shown in FIG. 9. The Stepper Motor is connected by a common control cable assembly that is shared by the Aerometer unit and routed back to the CommPuter controller as previously disclosed in U.S. Provisional Patent Application No. 60/886,905, and also disclosed in detail under a separate concurrent filing U.S. application No. TBD. FIG. 9 shows the Electric Auto Dampening Spool, in accordance with an embodiment of the present invention. FIG. 9 shows: 2 Dampening Spool mounting collar; 3 Adjustable leg screw; 4 foot plate; 5 adjustable leg locknut; 6 adjustable leg guide nut; 7 adjustable leg stabilizing plate; 19 Dampening spool with anchor slots; 22 Dampening spool collar welded stops; 24 Aerometer assembly with cups and servo; and 25 Dampening spool Stepper Motor.

The Second part of the Electric Automatic Wind Dampening System is an Aerometer as depicted as note #24 in FIG. 9. The Aerometer is electrically connected by a common control cable along with the Stepper Motor assembly back to the CommPuter controller System as previously disclosed in U.S. Provisional Patent Application No. 60/886,905, and also disclosed in detail under a separate filing under a separate concurrent filing U.S. application No. TBD.

The Action of wind turning the Aerometer cups (see FIG. 9 note 24) causes a signal voltage relative to current wind speed to be fed back to the CommPuter controller Command Processor circuit on the Segmented Addressable Communications Assembly (SACA) Junction Box motherboard as defined previously in and as previously disclosed in U.S. Provisional Patent Application No. 60/886,905, and also disclosed in detail under a separate concurrent filing U.S. application No. TBD. This input voltage is read by the Command Processor and either a rising or falling wind speed instructs the Command Processor to issue a forward for increasing or reversing for falling wind speed command to the Stepper Motor circuit and fed back up the common control cable, where the Electric Spooling system (see FIG. 9 note 25) either takes cable in tightening the tension springs or loosening to relieve tension off the tension springs uniformly.

The action of stretching or applying more tension to the springs (see FIG. 6 note 14) equally in 4 diametrically different directions causes a dampening or semi-restrictive action on the natural externally induced wind drag motion on the dish which due to size and angle is amplified in its reactive actions to the Platform to which it is applied. In a conventional roof top or larger earth station design, natural mass or the addition of weighted blocks or bags placed on the earth station base plate mounting system. Typically this can also cause great hardship on the installer when having to carry these heavy ballast weights to the roof to hopefully secure the dish and mount assembly or earth station. The ballasts act as a restrictive force on efforts of the wind to topple the rigid dish and mount assembly or earth station. Ballasts are the norm for the telecommunications industry as piercing the roof membrane to secure a dish and mount assembly or earth station, is highly frowned upon due to liability for roof leaks.

The primary advantage and choice point between the Manual (see FIG. 8) and the Electric Automatic Dampening Systems (see FIG. 9) is the ability of the later to react to the unexpected. The principles and uniqueness of the Gimbaled Mount System over conventional choices for the same application, is that a Gimbaled Mount System is designed to survive and not fail when communications are most needed. Like a Public Telephone System that is built to Telcordia© Standards of 5×9's or 99.999 percent uptime, the Gimbaled Mount System brings this type of unique reliability to wireless satellite communications unlike any other system before it.

Figure 10A:
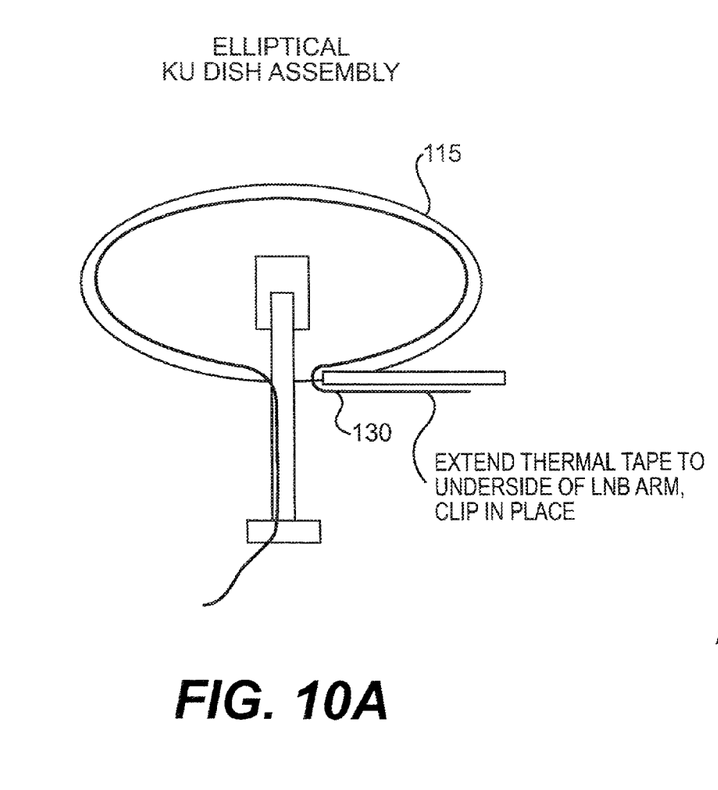
FIGS. 10A-10B show the path or placement of a thermal protection system of the Gimbaled Mount, as it relates to the dish and LNB assembly and overall Gimbaled Mount including pivot points, in accordance with exemplary embodiments of the present invention.
Figure 10B:
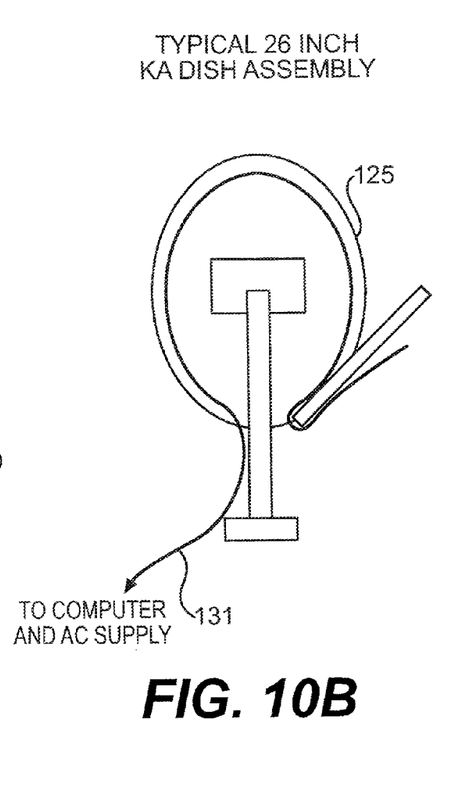

Wind is not the only threat to satellite systems, snow and ice damage can directly affect the operations of satellite dish or earth station. Snow laden dishes effectively change their parabolic curve therefore becoming less or non effective for receiving the weak satellite signals. Customary sweeping or brushing off the dish surface takes labor and sometimes results in temporary outages until the snow or ice is removed. By Installing a thermal heating cord, in accordance with an exemplary embodiment, along the backside of the Dish as detailed in attached drawings (see FIG. 10), the underside of the Low Noise Amplifier module, and crucial pivot points on the Gimbaled Mount assembly, the dish with only the aide of a thermostat set, for example, at 34 degrees Fahrenheit (1 degree Celsius) keeps the Dish clear of snow or ice, and the pivots remain unclogged while the dish operation is maintained even through a major snowfall or ice storm.

Figure 4:
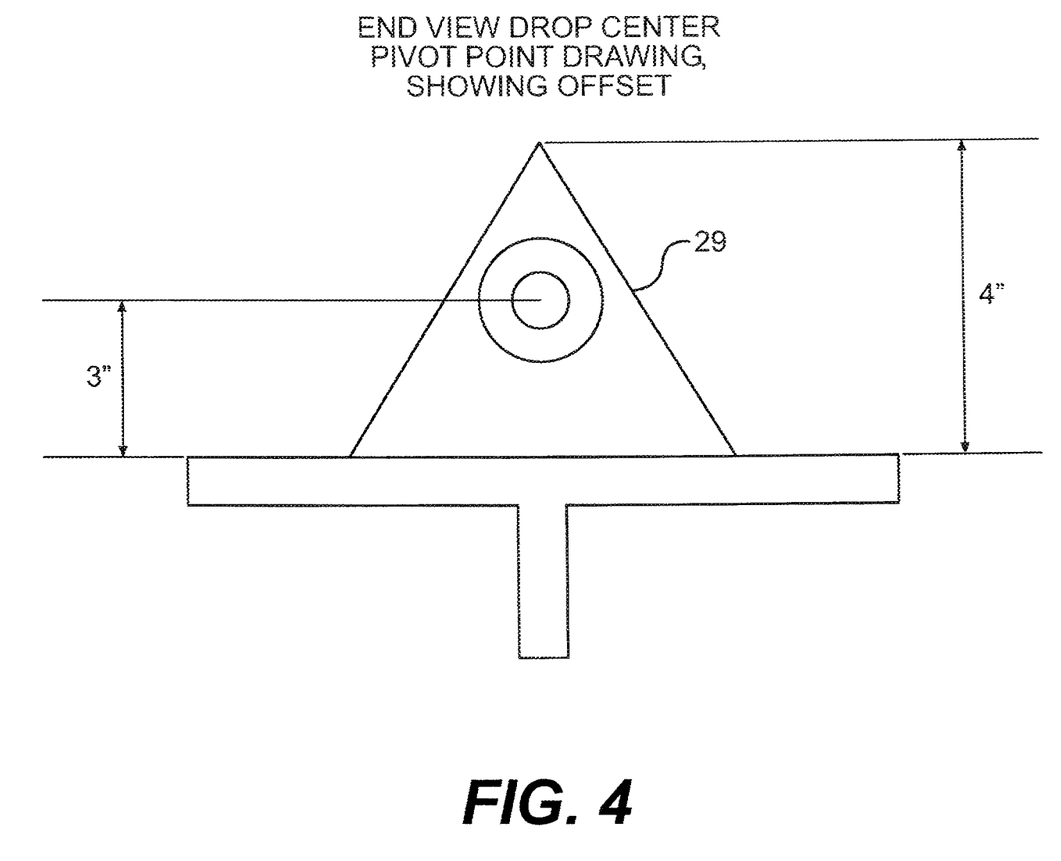
FIG. 4 is an End view of Drop Center Pivot Point Mounting.

The construction of the gimbaled portion of the mount assembly will now be disclosed in detail, in accordance with an exemplary embodiment. Inset 2 inches in from the Outer Ring is the Inner Ring a secondary support ring with two exactly opposite 2 inch drop offset pivot brackets made of stainless steel welded to the secondary ring. The support portion of the L-bracket allows the ring to sit 2 inches lower than the top surface of the outer main ring. The L-brackets as detailed in FIG. 3, allows the 43.5 inch diameter Secondary Ring, to pivot on these two brackets when a blade or wedge type extension with case hardened pivot surface point rests in matching V-grooves prepared in the Primary 48 inch diameter outer Primary Ring. The Secondary Inner Ring also has, directly opposite each other, 2 V-grooves cut in the top edge of this Ring. Ordinarily this would continue to make the Inner Ring unstable, however from these 2 V-grooves in the Secondary Ring to 4 inch high triangle type plates as detailed in FIG. 4 with similar mating blade extensions welded onto, rest in these 2 v-grooves.

The Platform, in accordance with an exemplary embodiment is shown in FIG. 7 in this overall assembly is a disc like 39 inch diameter platform for the satellite dish equatorial mount to be attached to. Various mounting holes in the Platform allow for minute adjustment of the position of several different types of Dishes and Equatorial Mounts to fastened and still maintain a balance point relative to the side mounted Pivot plates. The installer uses once again a 4 foot bubble level, to establish actual flat position of the Platform. The actual weight of the Dish and Mount assembly along with the weight of the Platform assembly itself when dropped drop 3 inches below the pivot points (see FIG. 7 note 13) causes the Platform to remain stable and plum to a gravitational point, much like a ships compass does in a rolling sea.

At the dead center of the 39 inch diameter Platform Plate and extending 3 inches down is the Stabilizer Spring Anchor Pin, (see FIG. 7 note 16). This Pin along with the Wind Dampening System and spring assemblies keeps the stability of the Platform constant even with wind drag on the topside dish assembly. The Aerometer (see note #23 in FIG. 9) detects the wind speed, feeds back a proportional voltage to the CommPuter controller where the on-board Command Processor located on the Hercules SACA Junction Box motherboard translates the voltage to an appropriate output command back up the same common cable to the Stepper Motor (see FIG. 9 note 25) winch system which increases or decrease the rotation of the winch drum thereby pulling more or less on the Tension Springs (see FIG. 6, note 14) and thereby dampening or negating the effect of the wind drag on the dish assembly.

While specific alternatives to steps of the invention have been described herein, additional alternatives not specifically disclosed but known in the art are intended to fall within the scope of the invention. Thus, it is understood that other applications of the present invention will be apparent to those skilled in the art upon reading the described embodiments and after consideration of the appended claims and drawings.

What is claimed is:

1. A method of non-motorized wind damping on a gimbaled mount system for satellites, the method comprising:
providing a dampening spool system comprising:
an adjustment collar surrounding a post tube;
a collar lock bolt on the adjustment collar; and
a collar stop in communication with the adjustment collar;
providing one or more tension springs coupled to the dampening spool system, wherein
the one or more tension springs are coupled at an opposite end to a center pin;
wherein one or more dampening cables are secured to loose ends of the one or more tension springs; and
rotating the dampening spool system to cause the one or more tension springs to be equally tension loaded.

2. The method of claim 1, wherein opposite ends of the one or more dampening cables are secured to the dampening spool system.

3. The method of claim 2, further comprising bringing the one or more dampening cables taught without stretching of the one or more tension springs.

4. The method of claim 2, further comprising stretching the one or more tension springs with the dampening spool system.

5. The method of claim 1, further comprising locking the dampening spool system when correct tension is reached.

6. The method of claim 5, wherein the locking is via the collar lock bolt.

7. The method of claim 1, wherein the dampening spool system further comprises one or more screw adjustable feet comprising an adjustable leg screw, a foot plate, an adjustable leg locknut, an adjustable leg guide nut, and an adjustable leg stabilizing plate.

8. The method of claim 1, wherein the one or more tension springs are coupled to the dampening spool system by one or more dampening cables.

9. The method of claim 8, wherein the one or more dampening cables are coupled at an opposite end to one or more legs.

10. The method of claim 9, wherein the one or more legs are coupled to one or more pulleys for coupling the one or more dampening cables.

11. The method of claim 8, wherein loose ends of the one or more dampening cables are looped around a spool drum core.

12. The method of claim 1, wherein the center pin is coupled to a center platform.

13. The method of claim 1, wherein stretching of the one or more tension springs is only by the dampening spool system.

14. The method of claim 1, wherein the collar stop is approximately halfway down the post tube.

15. A method of non-motorized wind damping on a gimbaled mount system for satellites, the method comprising:
providing a dampening spool system comprising:
an adjustment collar surrounding a post tube;
a collar lock bolt on the adjustment collar; and
a collar stop in communication with the adjustment collar;
providing one or more tension springs coupled to the dampening spool system, wherein
the one or more tension springs are coupled to the dampening spool system by one or more dampening cables, wherein the one or more dampening cables are coupled at an opposite end to one or more legs, and wherein the one or more legs are coupled to one or more pulleys for coupling the one or more dampening cables;
rotating the dampening spool system to cause the one or more tension springs to be
equally tension loaded.

16. The method of claim 15, further comprising stretching the one or more tension springs with the dampening spool system.

17. The method of claim 15, further comprising locking the dampening spool system when correct tension is reached via the collar lock bolt.

18. The method of claim 15, wherein the one or more dampening cables are coupled at an opposite end to one or more legs, wherein the one or more legs are coupled to one or more pulleys for coupling the one or more dampening cables.

* * * * *